(12) United States Patent
Barron et al.

(10) Patent No.: US 7,718,550 B2
(45) Date of Patent: May 18, 2010

(54) METHOD FOR LOW TEMPERATURE GROWTH OF INORGANIC MATERIALS FROM SOLUTION USING CATALYZED GROWTH AND RE-GROWTH

(75) Inventors: Andrew R. Barron, Houston, TX (US); Elizabeth Anne Whitsitt, Houston, TX (US)

(73) Assignee: William Marsh Rice University, Houston, TX (US)

( * ) Notice: Subject to any disclaimer, the term of this patent is extended or adjusted under 35 U.S.C. 154(b) by 790 days.

(21) Appl. No.: 10/535,358

(22) PCT Filed: Nov. 18, 2003

(86) PCT No.: PCT/US03/37012
§ 371 (c)(1),
(2), (4) Date: Jan. 11, 2006

(87) PCT Pub. No.: WO2004/047162
PCT Pub. Date: Jun. 3, 2004

(65) Prior Publication Data
US 2006/0135001 A1 Jun. 22, 2006

Related U.S. Application Data

(60) Provisional application No. 60/427,392, filed on Nov. 19, 2002.

(51) Int. Cl.
*H01L 21/31* (2006.01)
(52) U.S. Cl. .............................. 438/782; 257/E21.174
(58) Field of Classification Search ................. 438/782; 257/E21.174
See application file for complete search history.

(56) References Cited

U.S. PATENT DOCUMENTS

| | | | |
|---|---|---|---|
| 2,505,629 A | | 4/1950 | Thomsen et al. |
| 3,634,113 A | * | 1/1972 | Fehrenbacher .............. 501/103 |
| 4,431,683 A | | 2/1984 | Sasaki et al. |

(Continued)

FOREIGN PATENT DOCUMENTS

EP    0510191 A1    10/1992

OTHER PUBLICATIONS

Foreign Communication from a related counterpart application—Supplementary European Search Report, EP 03786878, Jan. 24, 2008, 3 pages.

(Continued)

*Primary Examiner*—Trung Dang
(74) *Attorney, Agent, or Firm*—Conley Rose, P.C.; Rodney B. Carroll

(57) ABSTRACT

The present invention involves a method and apparatus for depositing a silicon oxide onto a substrate from solution at low temperatures in a manner that produces homogeneous growth of the silicon oxide. The method generally comprises the following steps: (a) Chemically treating a substrate to activate it for growth of the silicon oxide. (b) Immersing the treated substrate into a bath with a reactive solution. (c) Regenerating the reactive solution to allow for continued growth of the silicon oxide. In another embodiment of the present invention, the apparatus includes a first container holding a reactive solution, a substrate on which the silicon oxide is deposited, a second container holding silica, and a means for adding silica to the reactive solution.

20 Claims, 2 Drawing Sheets

U.S. PATENT DOCUMENTS

| | | | |
|---|---|---|---|
| 4,468,420 | A | 8/1984 | Kawahara et al. |
| 4,693,916 | A | 9/1987 | Nagayama et al. |
| 5,073,408 | A | 12/1991 | Goda et al. |
| 5,132,140 | A | 7/1992 | Goda et al. |
| 5,153,035 | A * | 10/1992 | Sakai et al. .............. 427/430.1 |
| 5,506,006 | A | 4/1996 | Chou et al. |
| 5,616,233 | A | 4/1997 | Jenn-Gwo et al. |
| 6,080,683 | A | 6/2000 | Faur et al. |
| 6,613,697 | B1 * | 9/2003 | Faur et al. ................... 438/770 |
| 2002/0173170 | A1 * | 11/2002 | Liang et al. ................. 438/784 |
| 2003/0118064 | A1 * | 6/2003 | Zhao et al. .................... 372/39 |

OTHER PUBLICATIONS

Foreign Communication from a related counterpart application—Request, RU 2005119304, Feb. 19, 2008, 4 pages.

"The Initial Growth Mechanism of Silicon Oxide by Liquid-Phase Deposition", Chou, J.-S. and Lee, S.-C., J. Electrochem. Soc., vol. 140, No. 11, Nov. 1994, pp. 3214-3218.

"A Selective $SiO_2$ Film-Formation Technology Using Liquid-Phase Deposition for Fully Planarized Multilevel Interconnections", Hommo, T., Katoh, T., Yamada, Y., and Murao, Y., J. Electrochem. Soc., vol. 140, No. 8, Aug. 1993, pp. 2410-2414.

"Improved Formation of Silicon Dioxoide Films in Liquid Phase Deposition", Huang, C. J., Houng, M. P., Wang, Y. H., and Wang, N. F., J. Vac. Sci. Technol. A, vol. 16, No. 4, Jul./Aug. 1998, pp. 2646-2652.

"Photoassisted Liquid-Phase Deposition of Silicon Dioxide", Huang, C.-T., Chang, P.-H., and Shie, J.-S., J. Electrochem. Soc., vol. 143, No. 6, Jun. 1996, pp. 2044-2048.

"A New Process for Silica Coating", Nagayama, H., Honda, H., and Kawahara, H., J. Electrochem. Soc.: Solid State Science and Technology, vol. 135, No. 8, Aug. 1988, pp. 2013-2015.

"Characterization of Silica on Surface Preparation Processes for Advanced Gate Dielectrics", Okorn-Schmidt, H. F., IBM J. Res. Develop., vol. 43, No. 3, May 1999, pp. 351-365.

* cited by examiner

METHOD FOR LOW TEMPERATURE GROWTH OF INORGANIC MATERIALS FROM SOLUTION USING CATALYZED GROWTH AND RE-GROWTH

STATEMENT REGARDING FEDERALLY SPONSORED RESEARCH OR DEVELOPMENT

Not applicable.

BACKGROUND OF THE INVENTION

1. Field of the Invention

The present invention involves a method and apparatus for depositing a silicon oxide onto a substrate. More particularly, the present invention involves a method and apparatus for depositing a silicon oxide onto a substrate from solution at low temperatures in a manner that produces homogeneous growth of the silicon oxide.

2. Description of Related Art

There are various methods used to grow inorganic materials onto a substrate that are well-known in industry. However, these existing methods all have significant negative attributes that add to the expense and complexity of the process. For example, the growth of thin films of inorganic material in the electronics industry is often accomplished through the use of chemical vapor deposition (CVD). CVD requires the pyrolysis or photolysis of volatile compounds to create chemical fragments that are deposited on the surface of a substrate. The temperature of the substrate must be sufficiently high to allow mobility of fragments on the growth surface. These fragments travel around the surface until they find thermodynamically stable sites to which they attach. CVD therefore requires the use of high temperatures, volatile compounds or low pressures, each of which adds to the environmental load of the process.

Another method used to grow inorganic materials is sol-gel. Although sol-gel is a low temperature method, it involves multiple steps to form a true inorganic material. In sol-gel, precursor compounds are dissolved in solution and reacted with additional reagents (usually water or an acid) to give a gel. If a film or coating is required, then the gel must be spin-coated onto the substrate. Since most sol-gels consist of nanoparticles or clusters with a significant organic content, additional thermal or chemical treatments are required to form a true inorganic material.

Previous research (U.S. Pat. No. 2,505,629; U.S. Pat. No. 5,073,408; U.S. Pat. No. 5,132,140) has described processes for deposition of $SiO_2$ layers on silicon surfaces using a room temperature (30 to 50° C.) solution growth. The growth of liquid-phase deposited (LPD) $SiO_2$, for deposition of $SiO_2$ on the surface of soda lime silicate glass, is based on the chemical reaction of $H_2SiF_6$ with water to form hydrofluoric acid and solid $SiO_2$. However, one of the major disadvantages of previous $SiO_2$ LPD methods is the very low deposition rate of about 8 nm/hour. This low deposition rate makes it impractical for growing insulator layers for most applications. There exists, therefore, a need for a method to uniformly grow inorganic materials in a low temperature process with a high deposition rate.

In order to increase the rate of film growth several additives have been used. Initially most researchers investigated boric acid (U.S. Pat. No. 4,468,420; Nagayama, et al., 1988; Homma, et al., 1993; Chou and Lee, 1994; Huang, et al., 1998). As an alternative various metal compounds have been investigated (U.S. Pat. No. 4,431,683; U.S. Pat. No. 4,693,916) or a combination of organic additives (U.S. Pat. No. 6,080,683). However, while these approaches do result in faster film growth, the additives are incorporated into the films and in some cases film quality suffers from the presence of the additives. Further approaches involve the use of photolysis to assist film growth (Huang, et al., 1996) or electrolytic reactions (U.S. Pat. No. 5,616,233).

SUMMARY OF THE PREFERRED EMBODIMENTS

In the following discussion of the present invention, silica or silicon oxide is understood to include materials containing silicon, oxygen and possibly other elements, including but not limited to fluorine and hydrogen.

The present invention involves a method and apparatus for depositing a silicon oxide onto a substrate from solution at low temperatures in a manner that produces homogeneous growth of the silicon oxide.

The method generally comprises the following steps: 1. Chemically treating a substrate to activate it for growth of the silicon oxide. 2. Immersing the treated substrate into a bath with a reactive solution. 3. Regenerating the reactive solution to allow for continued growth of the silicon oxide.

In another embodiment of the present invention, the apparatus includes a first container holding a reactive solution, a substrate on which the silicon oxide is deposited, a second container holding silica, and a means for adding silica to the reactive solution. In yet another embodiment, an additional container with silica is included to permit switching of the containers upon depletion of the silica quantity currently in use.

BRIEF DESCRIPTION OF THE DRAWINGS

For a more detailed understanding of the preferred embodiments, reference is made to the accompanying Figures, wherein.

DETAILED DESCRIPTION OF THE PREFERRED EMBODIMENTS

Figure 1:
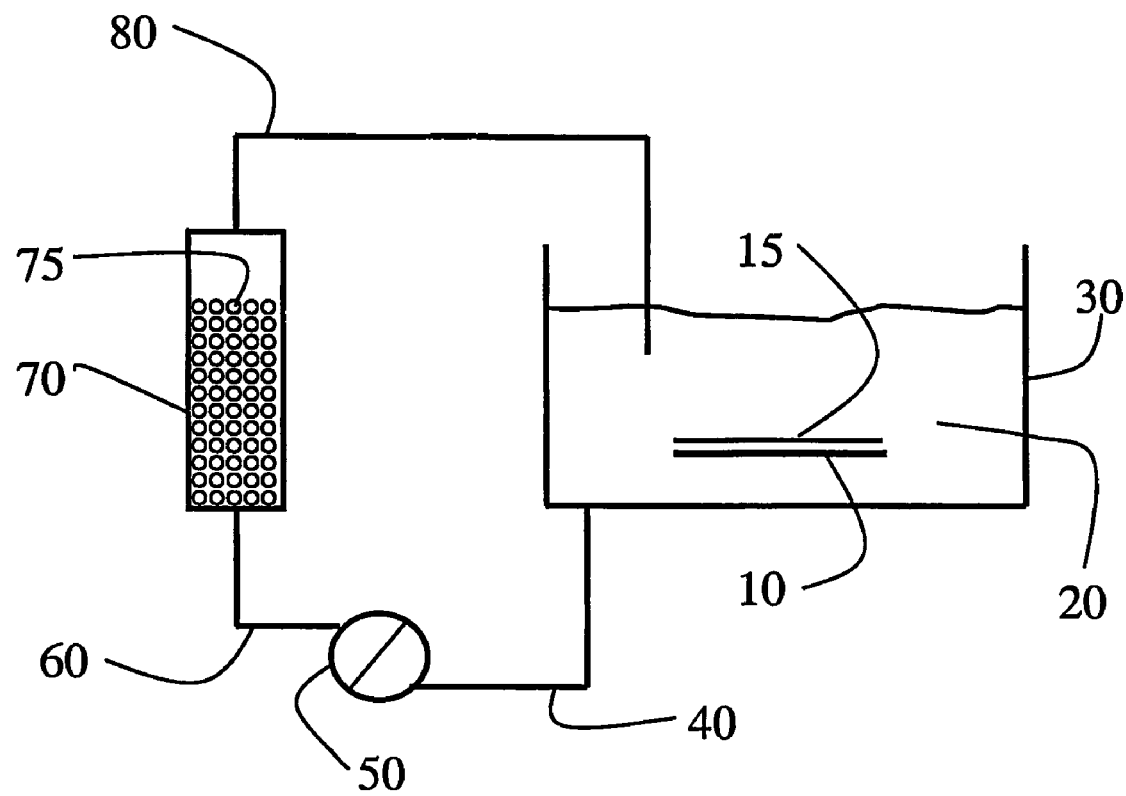
FIG. 1 is a schematic diagram of an apparatus constructed in accordance with a first embodiment of the present invention utilizing a single quantity of silica.

Referring initially to FIG. 1, a substrate 10 is immersed in a reactive solution 20 held in a first container 30. A pipe 40 provides fluid communication between first container 30 and a pump 50, such that reactive solution 20 enters pump 50. Pump 50 then transfers reactive solution 20 to a second container 70 via a pipe 60. Disposed within second container 70 is a quantity of silica (silicon oxide) 75. A pipe 80 provides fluid communication between second container 70 and first container 30 such that reactive solution 20 exits second container 70 and re-enters first container 30.

In this embodiment of the present invention, substrate 10 is chemically treated to activate it for growth of a silicon oxide film 15. The methods used to activate a substrate for growth of a silicon oxide are well known in industry and include those described in "Characterization of Silica on Surface Preparation Processes for Advanced Gate Dielectrics", Okorn-Schmidt, H. F., IBM J. Res. Develop., vol. 43, No. 3, May 1999, pp. 351-365. Substrate 10 must be treated so that substrate 10 is the most reactive component in the apparatus (i.e., the growth constant of silicon oxide for substrate 10 is greater than the growth constant for first container 30 or reactive solution 20). After substrate 10 has been chemically treated, it is immersed in reactive solution 20 held in first container 30. In one embodiment, reactive solution 20 comprises $H_2SiF_6 + H_2O$. As reactive solution 20 comprising $H_2SiF_6 + H_2O$ continues to react, $SiO_2$ and HF are formed. Substrate 10 has been chemically treated by first immersing it in a solution of ammonium hydroxide ($NH_4OH$) hydrogen peroxide ($H_2O_2$) and water in a 1:1:6 ratio at 60 to 80° C. for 5 minutes, rinsing with water and then drying. This is followed by a 5 minute hydrochloric acid (HCl), $H_2O_2$ and water (1:1:5) bath at 60-80° C. The substrate is then rinsed with water and dried again before being introduced into the growth solution. As a result of this treatment, $SiO_2$ grows on substrate 10 as silicon oxide film 15. Without external influences, the growth of silicon oxide film 15 on substrate 10 would continue until the HF produced by the reaction etches silicon oxide film 15 at a rate equal to the growth of silicon oxide film 15. At that point, an equilibrium would be reached and reactive solution 20 would no longer produce growth of silicon oxide film 15 onto substrate 10.

The embodiment of the present invention shown in FIG. 1 overcomes this problem by providing a mechanism for adding a second container 70 that contains a quantity of silica 75. The addition of silica 75 to reactive solution 20 reduces the etching of silicon oxide film 15 on substrate 10 and permits continued growth of silicon oxide film 15. This is accomplished because the added silica 75 reacts with the HF to produce $H_2SiF_6$ and regenerate reactive solution 20 so that growth of silicon oxide film 15 is continued. The addition of silica 75 is accomplished in the embodiment of FIG. 1 by providing a pump 50 that is in fluid communication with first container 30 via pipe 40. This arrangement allows reactive solution 20 to enter pump 50. Pump 50 then transfers reactive solution 20 to second container 70 via pipe 60. When reactive solution 20 enters second container 70, it contacts silica 75. Silica 75 and HF (found in reactive solution 20) react to form $H_2SiF_6$ and thereby regenerate reactive solution 20. Pipe 80 provides fluid communication between second container 70 and first container 30 such that regenerated reactive solution 20 exits second container 70 and re-enters first container 30. This permits reactive solution 20 to support continued growth of silicon oxide film 15 on substrate 10 until the desired thickness is reached. Components of pump 50, second container 70, and pipes 40, 60, and 80 that come into contact with reactive solution 20 should be constructed of an inert material, such as Teflon, to avoid any reaction or contamination with reactive solution 20.

It is understood by those skilled in the art that the use of pump 50 in FIG. 1 is just one method of introducing silica 75 to reactive solution 20. Other methods of adding silica 75 to reactive solution 20 may be utilized, such as the gravity feed of a solid or solution, an Archimedes' screw, a siphon, or other method known in the art.

The embodiment of the present invention shown in FIG. 1 demonstrates numerous advantages over methods of inorganic material film growth known in the prior art. For example, the embodiment of the present invention shown in FIG. 1 does not require the elevated temperatures, volatile compounds, or low pressures of CVD. In addition, unlike sol-gel, no additional thermal or chemical treatments are needed to form a true inorganic material. The embodiment of FIG. 1 also promotes uniform growth of silicon oxide film 15 onto substrate 10. Previous attempts to sustain growth of a silicon oxide film in solution used catalysts that caused precipitation in the reactive solution and non-uniform growth of the film as well as contamination of the film.

Other practical benefits may be realized through implementation of the embodiment shown in FIG. 1. For example, if the embodiment of FIG. 1 is utilized in an industry such as semiconductor manufacturing, the apparatus used to practice the embodiment will be similar to those employed in other manufacturing processes currently in use. This similarity in equipment will allow personnel already involved in semiconductor manufacturing to implement the embodiment of FIG. 1 with minimal, if any, retraining.

Figure 2:
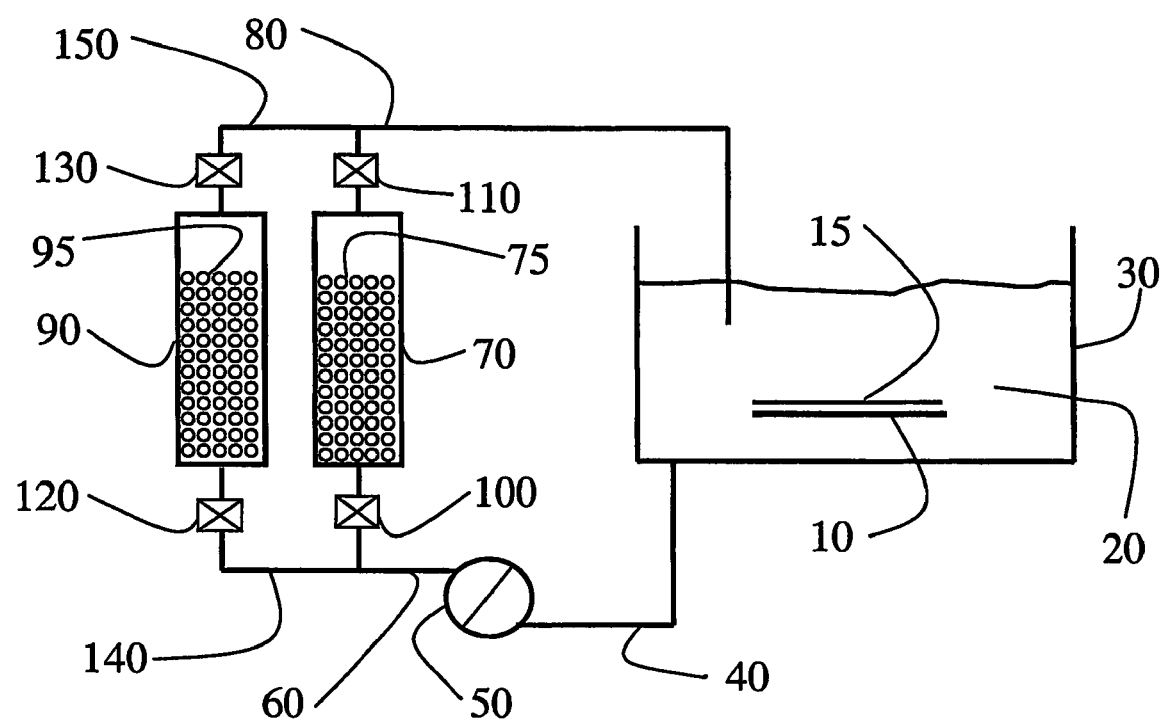
FIG. 2 is a schematic diagram of an apparatus constructed in accordance with a second embodiment of the present invention utilizing two quantities of silica.

A second embodiment of the present invention is shown schematically in FIG. 2. In this embodiment, as in FIG. 1, a substrate 10 is immersed in a reactive solution 20 held in a first container 30. A pipe 40 provides fluid communication between first container 30 and a pump 50, such that reactive solution 20 enters pump 50. Pump 50 then transfers reactive solution 20 to a second container 70 via pipe 60. Disposed within a second container 70 is a quantity of silica 75. Pipe 80 provides fluid communication between second container 70 and first container 30 such that reactive solution 20 exits second container 70 and re-enters first container 30.

The embodiment of FIG. 2, however, adds a second quantity of silica 95 disposed within a third container 90. The addition of silica 95 allows the process used to grow silicon oxide film 15 on substrate 10 to continue after silica 75 is depleted. Valves 100, 110, 120 and 130 may be opened or closed as needed to utilize either silica 75 or silica 95. For example, with valves 120 and 130 closed and valves 100 and 110 opened, reactive solution 20 will be regenerated by silica 75 by the process described in the discussion of FIG. 1. After silica 75 is depleted to a level where it is no longer providing adequate regeneration of reactive solution 20, valves 120 and 130 may be opened to allow silica 95 to regenerate reactive solution 20. With valves 120 and 130 open, and valves 100 and 110 closed, pipe 140 provides fluid communication from pump 50 to third container 90 such that reactive solution 20 enters into third container 90 and contacts silica 95. Again, reactive solution 20 is regenerated by the process described in the discussion of FIG. 1. Pipe 150 provides fluid communication between third container 90 and first container 30 such that reactive solution 20 exits third container 90 and re-enters first container 30. Valves 100 and 110 may then be closed and second container 70 may be removed to replenish silica 75. When silica 95 becomes depleted, valves 100 and 110 may be opened to allow the replenished silica 75 to regenerate reactive solution 20. Valves 120 and 130 may then be closed and silica 95 can be removed and replenished. In this manner, the process may be operated on a continual basis until the desired thickness of silicon oxide film 15 is deposited on substrate 10. Various monitoring processes may be used to determine when a quantity of silica has become depleted and the process should be switched to utilize the alternate quantity of silicon. Among these monitoring processes are pH measurements and spectrographic analysis of reactive solution 20.

Embodiments of the present invention will have useful application in various fields. One example of useful application is the growth of dielectric layers for semiconductor chips. Oxides (such as $SiO_2$) are used as the gate dielectric layers and inter-device insulation layers in present chip technology. Currently, most semiconductor chips are prepared by CVD. However, embodiments of the present invention may be implemented to provide a less expensive and less complex method for growing dielectric layers.

In addition, embodiments of the present invention may be used to grow insulating layers for nano-based chips. These nano-based chips include a new generation of nano-tube or nano-wire chips currently being developed. While these devices are presently only two-dimensional, the application of embodiments of the present invention would provide a method of low temperature insulator growth needed for the development of vertical integration of nano-based chips.

In addition, embodiments of the present invention may be used in the growth of optical waveguides, which could be used in the semi-conductor industry to permit inter-chip communication optically rather than electronically. While lithography and CVD of silica waveguides are possible, both require several additional process steps. Given the known technology for fabrication of copper patterns on circuit boards, it is desirable to grow a silicon oxide waveguide directly onto the copper patterns. The copper will be a redundant substrate for the waveguide, but its patterning methodology is well understood and therefore the process would not add a significant number of additional processing steps.

In addition, embodiments of the present invention may be used in the growth of silica films for silicon-on-insulator (SOI), which would be used by the semiconductor industry to permit fabrication of devices with superior performance to bulk silicon devices. This is particularly important for very large scale integration (VLSI) circuit applications.

The above discussion and Figures are meant to be illustrative of the principles and various embodiments of the present invention. Numerous variations and modifications will become apparent to those skilled in the art once the above disclosure is fully appreciated. For example, various methods of regenerating the reactive solution with silica may be employed in addition to those described in the above discussion and Figures. In addition, the composition of the reactive solution and preparation of the substrate may be altered, depending on the type of inorganic film desired. It is intended that the following claims be interpreted to embrace all such variations and modifications. Sequential recitation of steps in the claims is not intended to require that the steps be performed sequentially, or that one step be completed before commencement of another step.

REFERENCES CITED

"The Initial Growth Mechanism of Silicon Oxide by Liquid-Phase Deposition", Chou, J.-S. and Lee, S.-C., J. Electrochem. Soc., vol. 140, No. 11, November 1994, pp. 3214-3218.

"A Selective $SiO_2$ Film-Formation Technology Using Liquid-Phase Deposition for Fully Planarized Multilevel Interconnections", Hommo, T., Katoh, T., Yamada, Y., and Murao, Y., J. Electrochem. Soc., vol. 140, No. 8, August 1993, pp. 2410-2414.

"Improved Formation of Silicon Dioxide Films in Liquid Phase Deposition", Huang, C. J., Houng, M. P., Wang, Y. H., and Wang, N. F., J. Vac. Sci. Technol. A, vol. 16, No. 4, July/August 1998, pp. 2646-2652.

"Photoassisted Liquid-Phase Deposition of Silicon Dioxide", Huang, C.-T., Chang, P.-H., and Shie, J.-S., J. Electrochem. Soc., vol. 143, No. 6, June 1996, pp. 2044-2048.

"A New Process for Silica Coating", Nagayama, H., Honda, H., and Kawahara, H., J. Electrochem. Soc.:Solid State Science and Technology, vol. 135, No. 8, August 1988, pp. 2013-2015.

"Characterization of Silica on Surface Preparation Processes for Advanced Gate Dielectrics", Okorn-Schmidt, H. F., IBM J. Res. Develop., vol. 43, No. 3, May 1999, pp. 351-365.

PATENTS CITED

Faur, et al., U.S. Pat. No. 6,080,683 (2000), Room temperature wet chemical growth process of SiO based oxides on silicon.

Goda, et al., U.S. Pat. No. 5,073,408 (1991), Method of depositing a silicon dioxide film.

Goda, et al., U.S. Pat. No. 5,132,140 (1992), Process for depositing silicon dioxide films.

Jenn-Gwo, et al., U.S. Pat. No. 5,616,233 (1997), Method for making a fluorinated silicon dioxide layer on silicon substrate by anodic oxidation at room temperature.

Kawahara, et al., U.S. Pat. No. 4,468,420 (1984), Method for making a silicon dioxide coating.

Nagayama, et al., U.S. Pat. No. 4,693,916 (1987), Method of depositing a silicon dioxide film.

Sasaki, et al., U.S. Pat. No. 4,431,683 (1984), Process for producing transparent electroconductive film.

Thomsen, S. M. et al., U.S. Pat. No. 2,505,629 (1949), Method of depositing silica films and preparation of solutions therefor.

What is claimed is:

1. A method for depositing an inorganic material from a reactive solution onto a substrate, comprising:
   chemically treating said substrate to activate growth of said inorganic material;
   immersing said substrate into said reactive solution wherein the reactive solution is in a first container;
   using a monitoring process to determine when said reactive solution becomes depleted to form a depleted composition;
   transferring the depleted composition from the first container to a second container, wherein the second container is in fluid communication with the first container;
   regenerating the depleted composition to form a regenerated reactive solution; and
   transferring the regenerated reactive solution to the first container to allow for continuous growth of said inorganic material onto said substrate, wherein the monitoring process comprises pH measurements, spectrographic analysis or both.

2. The method of claim 1 wherein the inorganic material is a silicon oxide.

3. The method of claim 1 wherein the substrate is a silicon wafer.

4. The method of claim 1 wherein the substrate is a component of a semiconductor chip.

5. The method of claim 1 wherein the substrate is a component of a nano-based chip.

6. The method of claim 1 wherein the inorganic material forms an optical waveguide.

7. The method of claim 1 wherein the reactive solution is comprised of $H_2SiF_6$ and $H_2O$.

8. The method of claim 1 wherein the reactive solution is regenerated by the addition of silicon.

9. The method of claim 1 wherein the chemically treating the substrate further comprises immersing the substrate in a solution of ammonium hydroxide, hydrogen peroxide, and water.

10. The method of claim 9 wherein the ammonium hydroxide, hydrogen peroxide, and water is in a ratio of about 1:1:6.

11. The method of claim 10 wherein the chemically treating the substrate further comprises immersing the substrate in a solution of hydrochloric acid, hydrogen peroxide, and water.

12. The method of claim 11 wherein the hydrochloric acid, hydrogen peroxide, and water is in a ratio of about 1:1:5.

13. The method of claim 12 wherein the immersions of the chemical treatment are carried out at a temperature of about 60 to 80° C. for about 5 minutes.

14. The method of claim 1 wherein the regenerating the reactive solution further comprises reducing the amount of hydrofluoric acid in the reactive solution.

15. The method of claim 14 wherein the hydrofluoric acid is reduced via contact with silicon oxide.

16. The method of claim 15 wherein the hydrofluoric acid is converted to $H_2SiF_6$.

17. The method of claim 15 further comprising monitoring depletion of the silica.

18. The method of claim 17 further comprising replenishing the silica upon depletion.

19. The method of claim 1 wherein the immersing the substrate into the reactive bath is carried out at room temperature.

20. The method of claim 1 wherein the growth of the inorganic material on the substrate is homogeneous.

* * * * *